US007333586B2

(12) United States Patent
Jang

(10) Patent No.: US 7,333,586 B2

(45) Date of Patent: Feb. 19, 2008

(54) SHIFT REGISTER

(75) Inventor: Yong Ho Jang, Seongnam-si (KR)

(73) Assignee: LG. Philips LCD Co., Ltd., Seoul (KR)

(*) Notice: Subject to any disclaimer, the term of this patent is extended or adjusted under 35 U.S.C. 154(b) by 89 days.

(21) Appl. No.: 11/167,620

(22) Filed: Jun. 27, 2005

(65) Prior Publication Data

US 2006/0146978 A1 Jul. 6, 2006

(30) Foreign Application Priority Data

Dec. 31, 2004 (KR) ..................... 10-2004-0118605

(51) Int. Cl.
*G11C 19/00* (2006.01)

(52) U.S. Cl. .......................................... 377/64; 377/79

(58) Field of Classification Search ..................... None
See application file for complete search history.

(56) References Cited

U.S. PATENT DOCUMENTS 6,426,743 B1 * 7/2002 Yeo et al. ................... 345/213
7,081,890 B2 * 7/2006 Park et al. .................. 345/204
2002/0186196 A1 * 12/2002 Park ........................... 345/100
2004/0104882 A1 * 6/2004 Kitani et al. ................ 345/100
2004/0227718 A1 * 11/2004 Park ........................... 345/100
2005/0134545 A1 * 6/2005 Jang et al. .................. 345/100
2005/0156856 A1 * 7/2005 Jang et al. .................. 345/100
2006/0128180 A1 * 6/2006 Gammons .................. 439/76.1

* cited by examiner

*Primary Examiner*—Tuan T Lam
(74) *Attorney, Agent, or Firm*—Brinks Hofer Gilson & Lione

(57) ABSTRACT

A shift register has a plurality of stages which output driving signals, each stage including a pull-up transistor to output a first clock signal in response to a logic value of a Q node; a pull-down transistor to supply a voltage from a first voltage supply source to the output in response to a logic value of a Qb node; a Q node controller to control the logic value of the Q node in response to any one of the previous stage's output signal and the next stage's output signal; and a Qb node controller to control the logic value of the Qb node to alternate repeatedly between low and high by use of at least one of a second clock signal, a third clock signal and the logic value of the Q node when the output signal is in a low state.

7 Claims, 12 Drawing Sheets

VSS VDD CLK1 CLK2 CLK3 CLK4 VSTART CLK N1 T1 T2 Q T8 10 T5 C1 Vout T3 T4 Qb T9 T6 T7 Vout2

10
Vout
CLK
T8
C1
T9
Qb
T7
Q
T2
T5
T6
N1
T1
T4
T3
Vout2
VSTART
CLK4
CLK3
CLK2
CLK1
VDD
VSS 20
Vout
CLK
T8
T9
C1
Qb
T7
Q
T10
T11
T2
T5
N2
T6
N1
T1
T4
T3
Vout2
VSTART
CLK4
CLK3
CLK2
CLK1
VDD
VSS

SHIFT REGISTER

PRIORITY CLAIM

This application claims the benefit of the Korean Patent Application No. P2004-118605 filed on Dec. 31, 2004, which is hereby incorporated by reference.

BACKGROUND OF THE INVENTION

1. Field of the Invention

The present invention relates to a drive circuit of a display device, and more particularly to a shift register that is adaptive for preventing malfunction and damage, and a driving method thereof.

2. Description of the Related Art

Recently, there have been developed various flat panel display devices that can reduce their weight and size which is an advantage over a cathode ray tube CRT. The flat panel display device includes a liquid crystal display LCD, a field effect display FED, a plasma display panel PDP, an electro luminescence EL display device and so on.

The liquid crystal display (hereinafter, referred to as "LCD") device among the flat panel display devices has its application range on a broadening trend owing to its characteristics such as lightness, slimness, low power consumption and so on. According to such a trend, the LCD has been used in office automation equipment, audio and video equipment and so on.

The related art liquid crystal display device controls the light transmissivity of liquid crystal by use of an electric field, thereby displaying a picture. For this, the liquid crystal display device includes a liquid crystal display panel where liquid crystal cells are arranged in a matrix shape with a drive circuit to drive the liquid crystal display panel.

The liquid crystal display panel has gate lines and data lines arranged to cross each other and the liquid crystal cells are located at areas provided by the crossing of the gate lines and the data lines. There are provided pixel electrodes and a common electrode in the liquid crystal display panel for applying the electric field to each of the liquid crystal cells. The pixel electrode is connected to a thin film transistor, which is a switching device. The thin film transistor supplies video data to the pixel electrode in accordance with signals of a data driver and a gate driver.

The drive circuit includes the gate driver to drive the gate lines and the data driver to drive the data lines. The gate driver sequentially supplies scan signals to the gate lines to sequentially drive the liquid crystal cells on the liquid crystal display panel line by line. The data driver supplies video signals to each of the data lines whenever the gate signal is supplied to any one of the gate lines. Accordingly, the liquid crystal display device controls the light transmissivity by the electric field applied between the pixel electrode and the common electrode in accordance with the video signal by liquid crystal cells, thereby displaying a picture.

The gate lines, which are horizontal lines of the liquid crystal matrix, are selected by the gate signal supplied from a shift register circuit.

FIG. 1 is a diagram briefly representing shift registers of a gate driver, and FIG. 2 is a diagram representing gate signals applied to each gate line. The gate driver includes a clock signal line for supplying a clock signal from a clock signal generating source, and the gate lines and shift registers SR1 to SRn for supplying the gate signals.

The shift register SR1 to SRn is synchronized with the clock signal to supply the gate signal to the gate line g1 to gn for selecting the liquid crystal cells bylines. For this, the shift register SR1 to SRn is connected to the gate line and the clock signal line. A start pulse (Start) (not shown) is supplied to the first shift register of the shift registers for generating the gate signal, and the output terminal of each shift register is connected to the input terminal of the next stage. Hereby, the output of the previous stage shift register is used as a start pulse of the next stage shift register.

The start pulse and the clock signal cause the gate signal supplied to the gate line g1 to gn to be shifted by gate lines g1 to gn, thereby supplying the shifted gate signal. And through this, the liquid crystal cell line is selected by lines.

FIG. 2 is a diagram briefly representing a drive waveform to drive the shift register SR of FIG. 1.

FIG. 3 shows signal waves of a gate output terminal Vg, a first clock signal line CLK1, a first output terminal Q and a second output terminal Qb of a switching signal generator. If the first output terminal Q has a high (high or 1) logic value and the second output terminal Qb has a low (low or 0) logic value, then the clock signal from the first clock signal line CLK1 is outputted through the gate output terminal Vg. On the contrary, if the first output terminal Q has a low logic value and the second output terminal Qb has a high logic value, then the clock signal is not outputted to the gate output terminal Vg even though the clock signal of the first clock signal line CLK1 has a high logic value. The period when the signal is supplied to the gate line gn through the gate output terminal Vg is very short in comparison with the period when there is no output to the gate output terminal Vg. In other words, for most of the period (about 90%), the second output terminal Qb has the high logic value. This is because it is required for the gate signal to have the low logic value.

However, if a high voltage is continuously applied to the gate terminal of the thin film transistor, i.e., the second output terminal Qb, the threshold voltage of the thin film transistor increases to make the mobility grow worse.

FIG. 4 is a diagram representing an increase of threshold voltage in accordance with the lapse of time.

Referring to FIG. 4, the vertical axis of coordinates represents the threshold voltage of the thin film transistor and the horizontal axis represents the lapse of time. In order to maintain the output of the gate output terminal Vg low, if a voltage is continuously applied to the second output terminal Qb, the threshold voltage increases as shown in FIG. 4. In this way, if the threshold voltage increases due to long time use, the thin film transistor is continuously deteriorated. In other words, if the voltage is continuously applied to the second output terminal Qb, there is a problem in that damage of the device or malfunction by the deterioration of the thin film transistor is generated.

SUMMARY OF THE INVENTION

A shift register having a plurality of stages which output an output signal through an output signal line by using any three of a first voltage supply source, a previous stage's output signal, a next stage's output signal, and first to fourth clock signals, includes: a pull-up transistor to output the first clock signal through the output signal line in response to a logic value of a first node ("Q node"); a pull-down transistor to supply a supply voltage from the first voltage supply source to the output signal line in response to a logic value of a second node ("Qb node"); a Q node controller to control the logic value of the Q node in response to any one of the previous stage's output signal and the next stage's output signal; and a Qb node controller to control the logic value of the Qb node to alternate repeatedly between low and high by use of at least one of the second clock signal, the third clock signal and the logic value of the Q node when the output signal line is in a low state.

In the shift register, the Q node controller includes: a first switch connected between the Q node and the previous stage's output signal line to be controlled by the previous stage's output signal; a second switch connected between the Q node and a first voltage supply source to be controlled by the next stage's output signal; and a third switch connected between the first voltage supply source and the Q node to be controlled by the logic value of the Qb node.

In the shift register, the Qb node controller includes: a fourth switch connected between a second voltage supply source, from which a second voltage is supplied, and the Qb node to be controlled by the second clock signal; a fifth switch connected between the Qb node and the first voltage supply source to be controlled by the second clock signal; a sixth switch connected between the Qb node and the first voltage supply source to be controlled by the previous stage's output signal; and a seventh switch connected between the Qb node and the first voltage supply source to be controlled by the logic value of the Q node.

In the shift register, the fourth switch is connected between the second voltage supply source and a second node.

The shift register further includes an eighth switch connected between the second voltage supply source and the Qb node to be controlled by a logic value of the second node.

In the shift register, the Qb node controller further includes a ninth switch connected between the Qb node and the first voltage supply source to be controlled by the second clock signal.

In the shift register, the Qb node controller further includes a tenth switch connected between the second node and the first voltage supply source to be controlled by the previous stage's output signal.

A driving method of a shift register having a plurality of stages which output an output signal through an output signal line by using any three of a first voltage supply source, a previous stage's output signal, a next stage's output signal, and first to fourth clock signals, according to another aspect of the present invention includes the steps of outputting the first clock signal through the output signal line in response to a logic value of a Q node; supplying a supply voltage from the first voltage supply source to the output signal line in response to a logic value of a Qb node; controlling the logic value of the Q node in response to any one of the previous stage's output signal and the next stage's output signal; and controlling the logic value of the Qb node to alternate repeatedly between low and high by use of at least one of the second clock signal, the third clock signal and the logic value of the Q node when the output signal line is in a low state.

In the driving method, a period when the logic value of the Qb node is high includes a period when the first clock signal is high.

Alternatively, a shift register which has an output signal generated in a next stage in response to a previous stage's output signal, may include: a pull-up transistor to output a first clock signal through an output signal line in response to a logic value of a Q node; a pull-down transistor to supply a supply voltage from a first voltage supply source to the output signal line in response to a logic value of a Qb node; a Q node controller to control the logic value of the Q node in response to any one of the previous stage's output signal and the next stage's output signal; and a Qb node controller to control the logic value of the Qb node to alternate repeatedly between low and high by use of at least one of the second clock signal and the logic value of the Q node when the output signal line is in a low state, and wherein a period when the logic value of the Qb node is high includes a period when the first clock signal is high.

A driving method of a shift register which has an output signal generated in a next stage in response to a previous stage's output signal, may include the steps of: outputting a first clock signal through an output signal line in response to a logic value of a Q node; supplying a supply voltage from a first voltage supply source to the output signal line in response to a logic value of a Qb node; controlling the logic value of the Q node in response to any one of the previous stage's output signal and the next stage's output signal; and controlling the logic value of the Qb node to alternate repeatedly between low and high by use of at least one of the second clock signal and the logic value of the Q node when the output signal line is in a low state, and wherein a period when the logic value of the Qb node is high includes a period when the first clock signal is high.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The Invention can be better understood with reference to the following drawings and description. The components in the figures are not necessarily to scale, emphasis instead being placed upon illustrating the principles of the invention. Moreover, in the figures, like referenced numerals designate corresponding parts throughout the different views, in which.

DETAILED DESCRIPTION

A shift register having a plurality of stages may be used to drive a display device. The plurality of stages is cascaded so that the output of one stage may be used as the input to a next stage and or a preceding stage. The shift register can reduce an accumulated voltage stress which is generated by a continuous voltage application to a node thereby preventing the deterioration of a connected thin film transistor.

Figure 1:
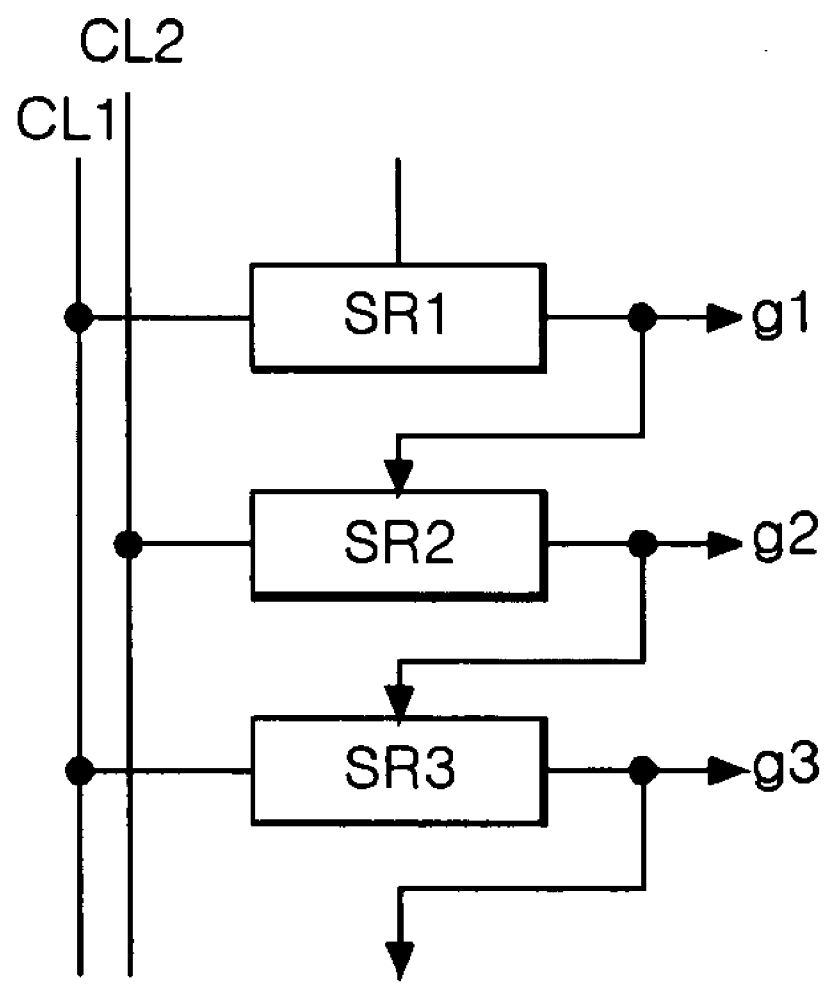
FIG. 1 is a diagram briefly representing shift registers of a gate driver.
Figure 2:
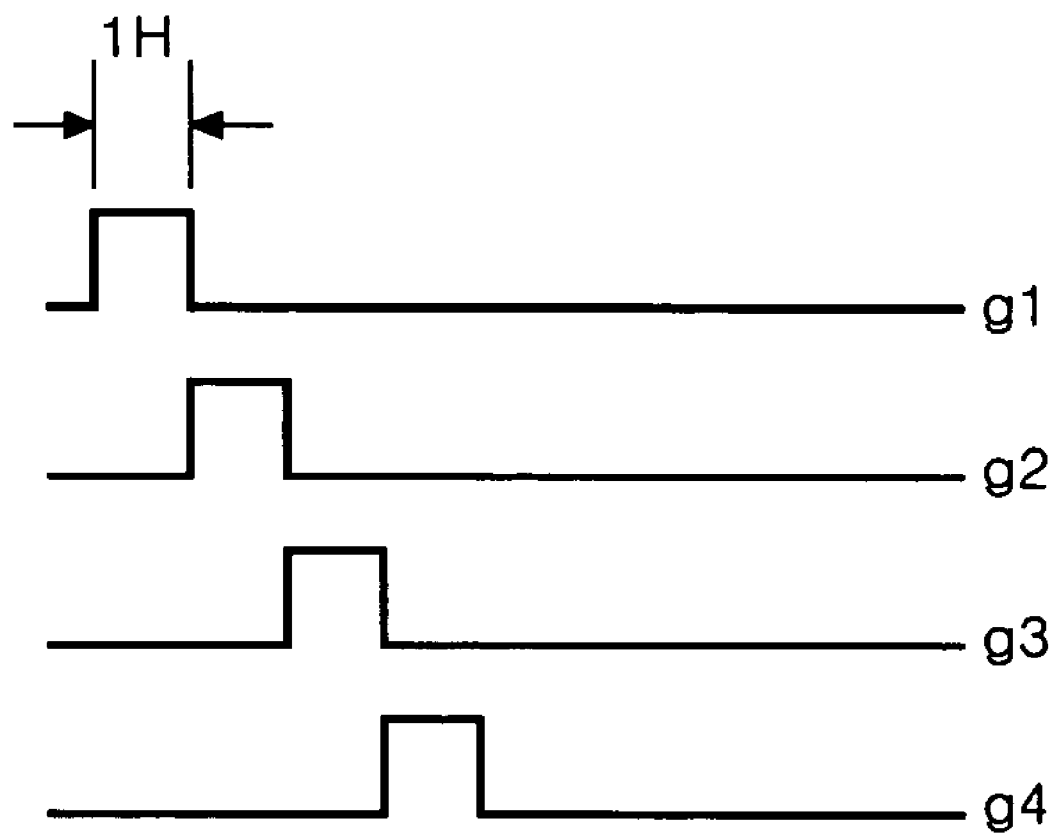
FIG. 2 is a diagram representing a gate signal applied to each gate line.
Figure 3:
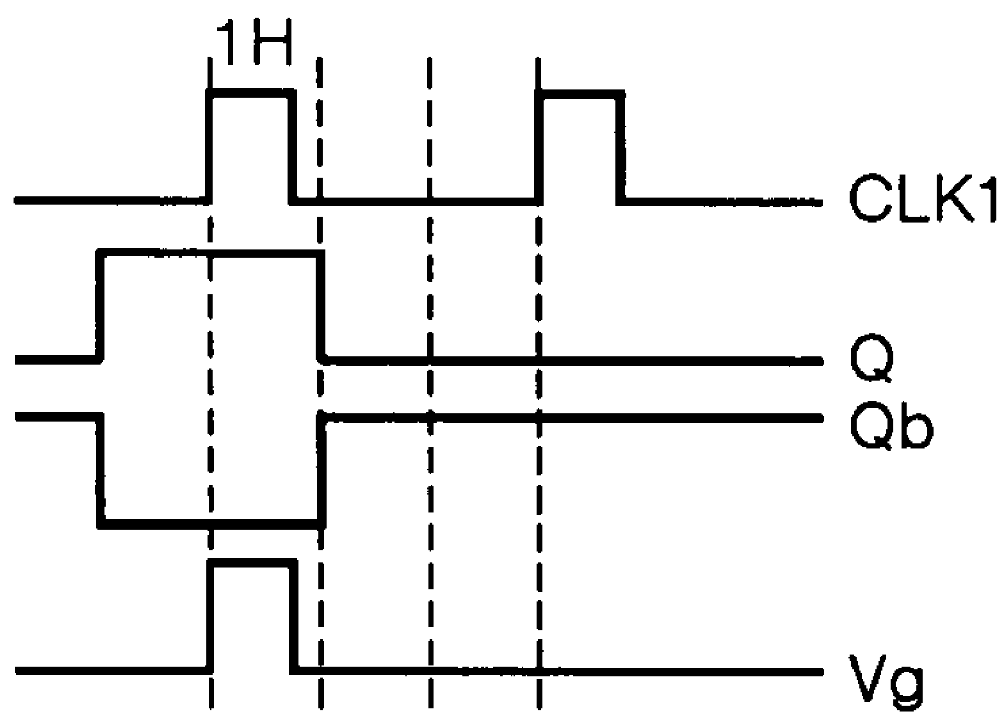
FIG. 3 is a diagram briefly representing a drive waveform for driving a shift register SR of FIG. 1.
Figure 4:
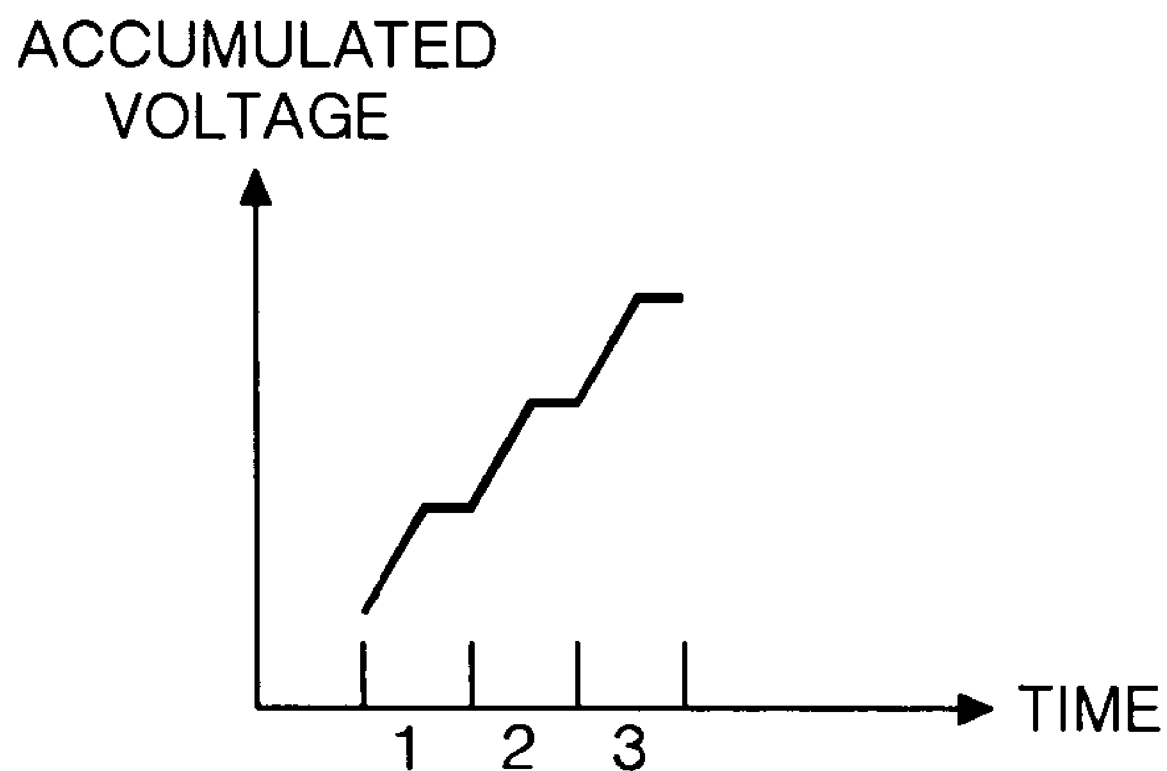
FIG. 4 is a diagram representing an increase of threshold voltage in accordance with the lapse of time.
Figure 5:
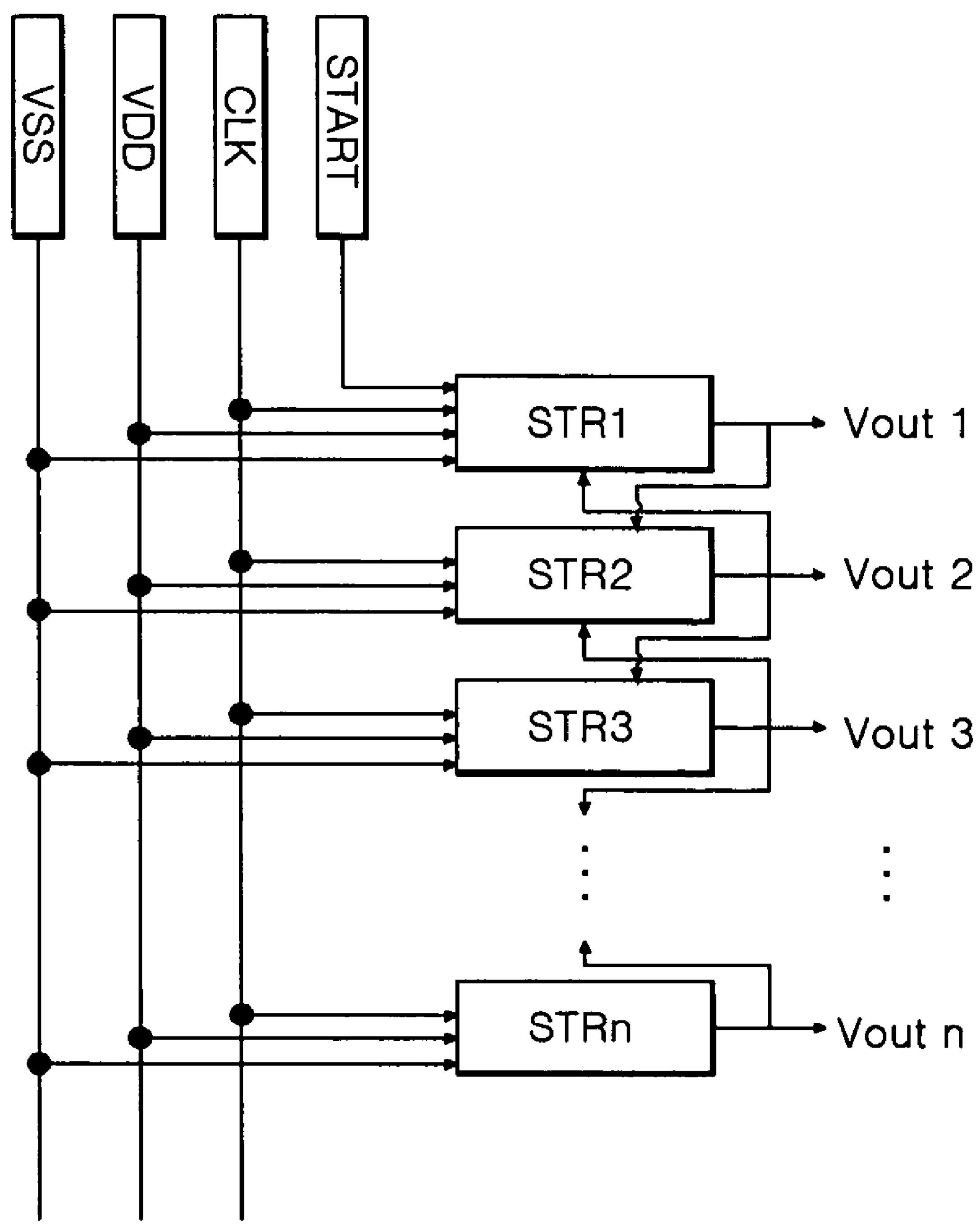
FIG. 5 is a circuit diagram representing an N phase shift register.

FIG. 5 is a circuit diagram representing an N phase shift register. The shift register shown in FIG. 5 includes the first to nth stages connected in cascade. Further, FIG. 6 is a circuit diagram representing each stage shown in FIG. 5.

Figure 6:
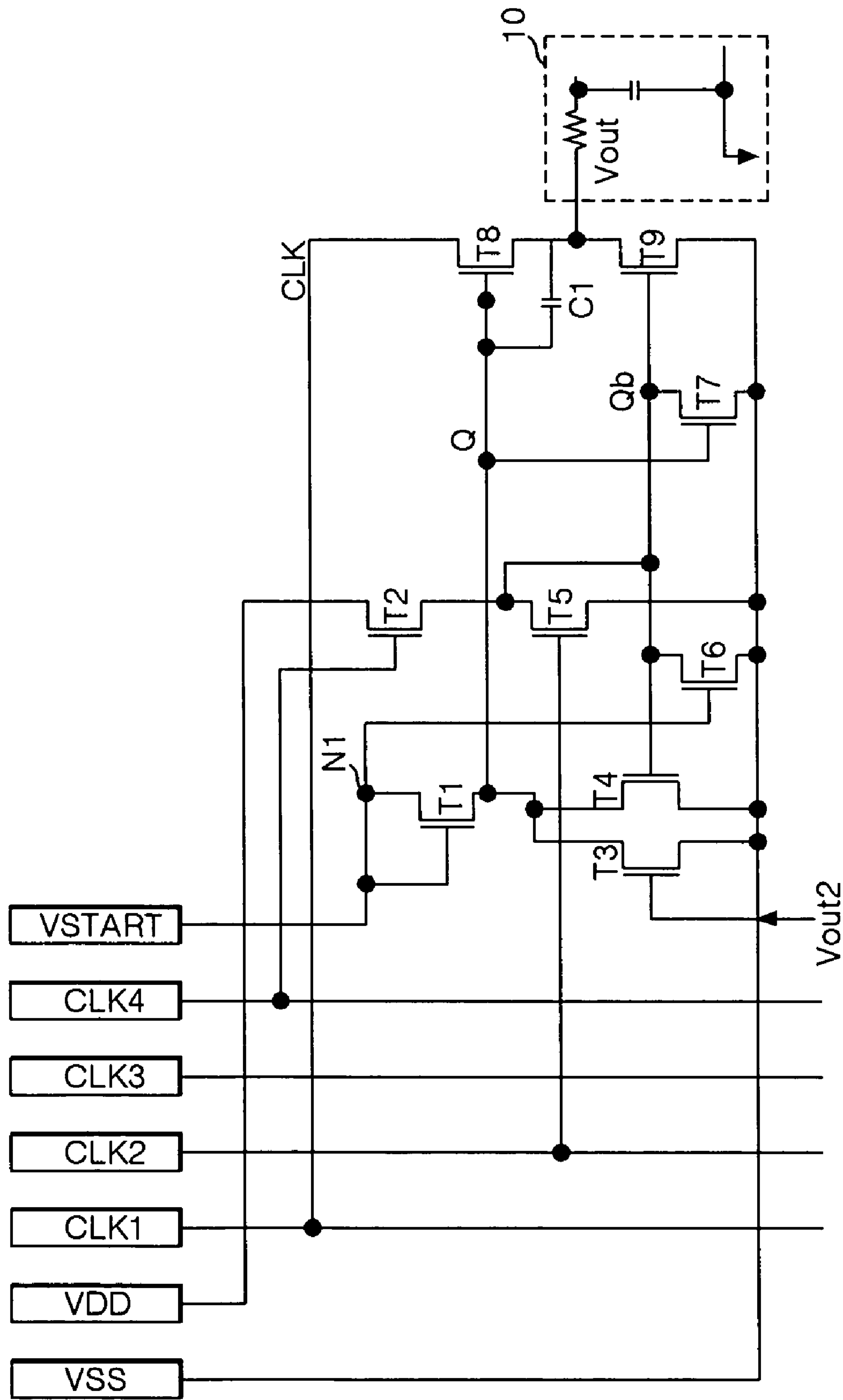
FIG. 6 is a circuit diagram representing each stage of the N phase shift register shown in FIG. 5.

Referring to FIGS. 5 and 6, the shift register includes n number of stages STR1 to STRn. The output lines of the n number of stages are each connected to the input terminal of a load circuit 10. Herein, the circuit connected to the output terminal Vout equivalently represents the load circuit 10.

A start pulse Vstart from a timing controller (not shown) is supplied to the first stage STR1, and the output signals Vout1 to Voutn−1 of the first to $(n-1)^{th}$ stages are each supplied to the next stage as a start pulse. The input signals of the shift register circuit have a designated period, and are applied from a power source circuit and a clock generator (not shown). The input signals include first to fourth clock signals CLK1 to CLK4, a supply voltage VDD and a ground voltage VSS.

Each stage STR1 to STRn has the same composition as the other except that there is no next stage input to the $n^{th}$ stage STRn as it is the last stage. Accordingly, only the first stage STR1 is taken as an example for explaining the first to $n^{th}$ stages STR1 to STRn.

The first stage STR1, as shown in FIG. 6, includes a first voltage supply line VSS; a second voltage supply line VDD; first to fourth clock signal lines CLK1 to CLK4; the previous stage's output signal supply line (or a start pulse supply line) Vstart; a first NMOS transistor T1 connected between a first node N1, the previous stage's output signal supply line Vstart and a Q node; a second NMOS transistor T2 connected between the first clock signal line CLK1, the second voltage supply line VDD and a Qb node; a third NMOS transistor T3 connected between the next stage's output Vout2, the first voltage supply line and the Q node; a fourth NMOS transistor T4 connected between the Q node, the Qb node and the first voltage supply line VSS; a fifth NMOS transistor T5 connected between a second clock signal line CLK2, the Qb node and the first voltage supply line VSS; a sixth NMOS transistor T6 connected between the first node N1, the Qb node and the first voltage supply line VSS; a seventh NMOS transistor T7 connected between the Q node, the Qb node and the first voltage supply line VSS; an eighth NMOS transistor T8 connected between the first clock signal line CLK1, the Q node and the output signal line Vout1; and a ninth NMOS transistor T9 connected between the first voltage supply line VSS, the Qb node and the output signal line Vout1.

The first to seventh NMOS transistors T1 to T7 are a controller for controlling the output, and the eighth and ninth transistors T8, T9 are an output buffer for outputting the first clock signal CLK1.

The controller includes a Q node charge/discharge controller for controlling the charge and discharge of the Q node, and a Qb node charge/discharge controller for controlling the charge and discharge of the Qb node. The Q node charge/discharge controller includes the first, third and fourth NMOS transistors T1, T3, T4 and includes a Q node charging part and a Q node discharging part. The Q node charging part includes the first NMOS transistor T1 that charges the Q node with the previous stage's output Vout from the previous stage's output signal line Vstart or the start pulse. The Q node discharging part includes the third NMOS transistor T3 that discharges the voltage charged in the Q node by the output signal Vout2 from the next stage's output signal line Vout2, and the fourth NMOS transistor T4 that discharges the voltage charged in the Q node by the voltage charged in the Qb node.

The Qb node charge/discharge controller includes the second, fifth, sixth and seventh NMOS transistors T2, T5, T6, T7, and includes a Qb node charging part and a Qb node discharging part.

The Qb node charging part includes the second NMOS transistor T2 that charges the Qb node with the supply voltage from the second voltage supply line VDD in response to the fourth clock signal CLK4.

The Qb node discharging part includes the sixth NMOS transistor T6 that discharges the voltage charged in the Qb node by the previous stage's output signal Vout or the start pulse Vstart; the seventh NMOS transistor T7 that discharges the voltage charged in the Qb node by the voltage charged in the Q node; and the fifth NMOS transistor T5 that discharges the voltage charged in the Qb node by the clock signal from the second clock signal line CLK2.

The first to fourth clock signals CLK1 to CLK4 each have the same period, and the second clock signal CLK2 is supplied with a designated delayed interval In regard to the first clock signal CLK1. The third clock signal CLK3 is supplied with a designated delayed interval in regard to the second clock signals and the fourth clock signal CLK4 is supplied with a designated delayed interval in regard to the third clock signal. Accordingly, if the first clock signal CLK1 is high level (high or 1), the second to fourth clock signals CLK2 to CLK4 are low level (low or 0). Because of this, a rising edge time of each of the first to fourth clock signals CLK1 to CLK4 has a designated interval. The first to fourth clock signals CLK1 to CLK4 are used as a signal for supplying the output signal Vout1 to the output line Vout or for discharging the voltage charged in the stage.

A voltage of low level L from a voltage source (not shown) is supplied to the first voltage supply line VSS, and a voltage of high level H from a voltage source (not shown) is supplied to the second voltage supply line VDD.

The first NMOS transistor T1 charges the Q node with the previous stage's output voltage Vout from the previous stage's output signal line Vstart or the start pulse from the timing controller (not shown).

The second NMOS transistor T2 charges the Qb node with the voltage from the second voltage supply source VDD in response to the fourth clock signal CLK4.

The third NMOS transistor T3 discharges the voltage charged in the Q node in response to the next stage's output signal Vout. For example, in the first stage STR1, the next stage's output signal Vout connected to the third NMOS transistor T3 is Vout2. The third NMOS transistor T3 controls the discharge of the Q node to control the on/off of the eighth NMOS transistor T8 of the output buffer and the seventh NMOS transistor T7 of the controller.

The fourth NMOS transistor T4 discharges the voltage charged in the Q node in response to the voltage charged in the Qb node. The fourth NMOS transistor T4 controls the discharge of the Q node to control the on/off of the eighth NMOS transistor T8 of the output buffer and the seventh NMOS transistor T7 of the controller.

The fifth NMOS transistor T5 discharges the charged voltage of the Qb node in response to the clock signal from the second clock signal line CLK2.

The sixth NMOS transistor T6 discharges the voltage charged in the Qb node by the previous stage's output signal Vout or the start pulse Vstart.

The seventh NMOS transistor T7 discharges the voltage charged in the Qb node in response to the voltage charged in the Q node.

The eighth NMOS transistor T8 allows the clock signal from the first clock signal line CLK1 to be outputted through the output signal line Vout in response to the voltage which is charged in and discharged from the Q node.

The ninth NMOS transistor T9 allows the voltage from the first voltage supply source VSS to the output signal line Vout in response to the voltage which is charged in and discharged from the Qb node.

A first capacitor C1 boosts the voltage in the Q node by as much as the voltage level of the first clock signal CLK1 when the clock signal from the first clock signal line CLK1 is supplied to the output line Vout through the eighth NMOS transistor T8. In other words, the voltage of the Q node is bootstrapped by the effect of the capacitor C1.

Herein, the gate terminal of the second NMOS transistor T2 of the second shift register STR2 is connected to the first clock signal line CLK1 differently from the second NMOS transistor T2 of the first stage STR1. Further, the gate terminal of the second NMOS transistor T2 of the third stage STR3 is connected to the second clock signal line CLK2. Further, the drain terminal of the eighth NMOS transistor T8 is connected to the first clock signal line CLK1 as shown in FIG. 6 in the first stage STR1, to the second clock signal line CLK2 in the second stage STR2, to the third clock signal line CLK3 in the third stage STR3, and to the fourth clock signal line CLK4 in the fourth stage STR4. The gate terminal of the fifth NMOS transistor T5 is connected to the second clock signal line CLK2 in the first stage STR1, to the third clock signal line CLK3 in the second stage STR2, to the fourth clock signal line CLK4 in the third stage STR3, and to the first clock signal line CLK1 in the fourth stage STR4. In this way, the gate terminal of the second NMOS transistor T2, the drain terminal of the eighth NMOS transistor T8 and the gate terminal of the fifth NMOS transistor T5 are connected to the first to fourth clock signal lines CLK1 to CLK4 by stages.

Figure 7:
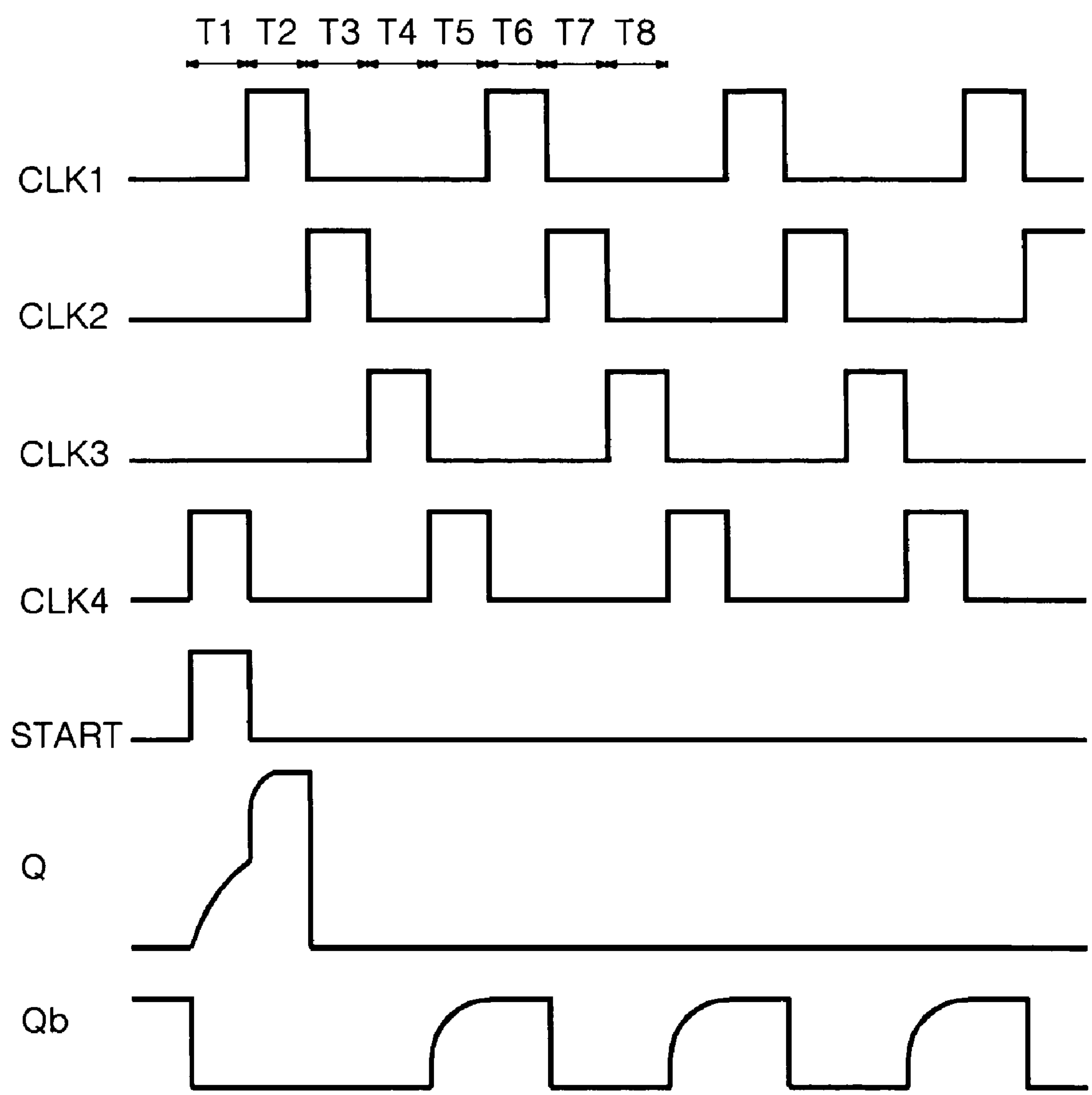
FIG. 7 is a diagram representing a drive waveform for driving a shift register of FIGS. 5 and 6, and an output waveform in accordance therewith.

FIG. 7 Is a diagram representing a drive waveform for driving a shift register of FIGS. 5 and 6 and an output waveform in accordance therewith. A driving method of the shift register according to the first embodiment of the present invention will be explained with reference to FIG. 7 in conjunction with reference to FIGsS 5 and 6.

In a T1 period, the start pulse or the previous stage's output signal is inputted in synchronization with the fourth clock signal CLK4. If the start pulse Vstart is inputted, the first NMOS transistor T1 is turned on and the Q node is charged with as much voltage as the start pulse Vstart. At the same time, if the fourth clock signal CLK4 is inputted, the second NMOS transistor T2 is turned on and the Qb node is charged with the voltage from the second voltage supply source VDD. However, the sixth NMOS transistor T6 is turned on by the start pulse Vstart and the seventh NMOS transistor T7 is turned on by the voltage charged in the Q node, thus the voltage charged in the Qb node is discharged through the first voltage supply source VSS.

In a T2 period, the logic value of the start pulse Vstart and the fourth clock signal CLK4 becomes low and the first clock signal CLK1 is supplied. Because the fourth clock signal CLK4 and the start pulse Vstart become the low logic value, the first and second and sixth NMOS transistors T1, T2, T6 are turned off. Accordingly, the voltage charged in the Q node has its charging and discharging path blocked to make the Q node floated into a high state, and the floated Q node causes the seventh and eighth NMOS transistors T7, T8 to remain in turned-on state even in the T2 period. The seventh NMOS transistor T7 remaining in turned-on state keeps the Qb node connected with the first voltage supply source VSS so that the Qb node is certain to be maintained in the low state. In addition, the first clock signal CLK 1 is outputted through the output signal line Vout via the eighth NMOS transistor T8 which remains turned on. At this moment, the voltage of the Q node is bootstrapped by the first capacitor C1 which is charged by the first clock signal CLK1, thereby becoming a higher level than the high level.

In a T3 period, the output of the next stage, i.e., the second stage STR2, is supplied to the gate terminal of the third NMOS transistor T3 to turn on the third NMOS transistor T3. The voltage charged in the Q node by the turned-on third NMOS transistor T3 is discharged through the first voltage supply source VSS via the third NMOS transistor T3. Hereby, the seventh NMOS transistor T7 is turned off. On the other hand, in the T3 period, the output signal Vout of the previous stage and the second clock signal is simultaneously supplied to the gate terminal of the fifth NMOS transistor T5, thereby turning on the fifth NMOS transistor T5. Because the fifth NMOS transistor T5 is turned on, as substitute for the role of the turned-off seventh NMOS transistor T7, the Qb node is made to continuously remain in the low state.

In a T4 period, no clock signal is supplied to the first stage STR1, thus the Q node and the Qb node all remain in the low state. Further, the output signal Vout1 outputted to the output signal line Vout is consumed in the load circuit 10 to become the low state.

In a T5 period, the start pulse Vstart or the previous stage's output signal Vout is not supplied and only the fourth clock signal CLK4 is supplied to the gate terminal of the second NMOS transistor T2, thereby turning on the second NMOS transistor T2. Accordingly, the high level voltage supplied from the second voltage supply source VDD is charged in the Qb node, and the ninth NMOS transistor T9 is turned on. The turned-on ninth NMOS transistor T9 causes the output signal line Vout and the first voltage supply source VSS to be connected. Hereby, the output signal line Vout stably remains at the low level.

In a T6 period, only the first clock signal CLK1 is supplied to the first stage STR1, but the first clock signal CLK1 is not supplied to the output signal line Vout because the eighth NMOS transistor T8 is turned off. Further, the voltage charged in the Qb node has its charging and discharge path blocked, thus the high level floating state is maintained.

In a T7 period, only the second clock signal is supplied to the second stage STR2. The fifth NMOS transistor T5 is turned on by the second clock signal CLK2, and the voltage charged in the Qb node is discharged to the first voltage supply source VSS by the fifth NMOS transistor T5. Hereby, the voltage of the Qb node is changed from high level to low level in the T7 period.

In a T8 period, no clock signal is supplied to the first shift register STR1, thus the Q node, the Qb node and the output signal line Vout continuously remain at the low level subsequently to the T7 period.

The T5 to T8 periods are repeated in the first stage STR1 until the start pulse Vstart is inputted again thereto or one vertical period is completed.

Figure 8:
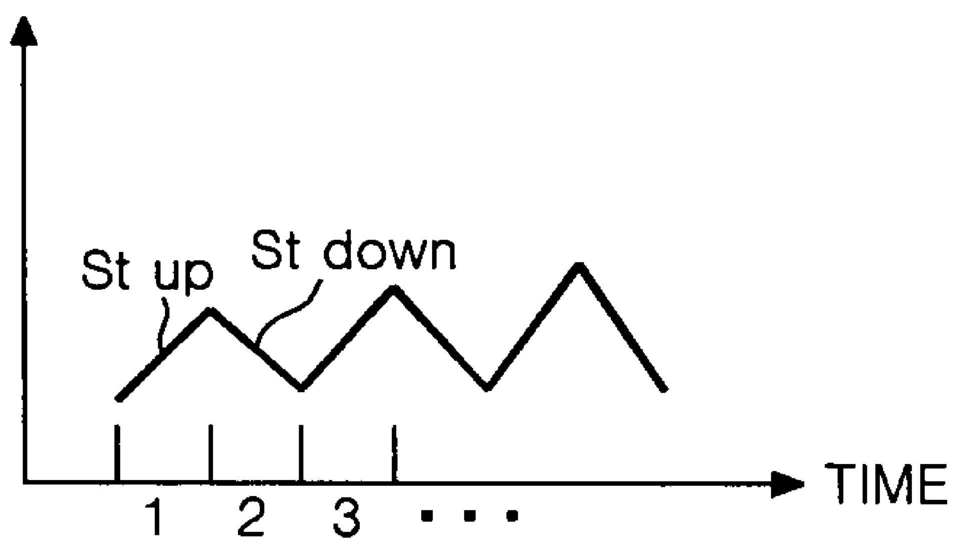
FIG. 8 is a diagram representing a voltage stress accumulated in a Qb node.

FIG. 8 Is a diagram representing a voltage stress accumulated in the Qb node. Referring to FIG. 8, it is known that the fifth to eighth periods T5 to T8 are repeated after each shift regIster STR1 to STRn outputs the output signal, thus the voltage stress accumulated in the Qb node does not continuously increase differently from the related art. Because the fifth to eighth period T5 to T8 are repeated, as shown in FIG. 8, the accumulated voltage stress increases (St-up) when the high level voltage is charged in the Qb node, and the accumulated voltage stress decreases (St-down) if the Qb node is discharged to maintain the low level voltage. Through this, differently from the related art, the shift register of the present invention can prevent the accumulated voltage stress caused by the accumulated voltage from continuously increasing and it is possible to prevent the deterioration of the circuit caused by the accumulated voltage stress.

The shift register causes the voltage of the Qb node to desirably remain at the high level during the period when inputting the clock signal which is used as the output signal Vout. Further, the period when the Qb node remains at the high level is not less than at minimum 25%, desirably 50%. Herein, the period is one vertical period or a period when the first to fourth clock signals are supplied once for each.

The drive waveform of FIG. 7 is only an example, and it should be understood that a variety of other applications are possible without departing from the spirit of the invention.

Figure 9:
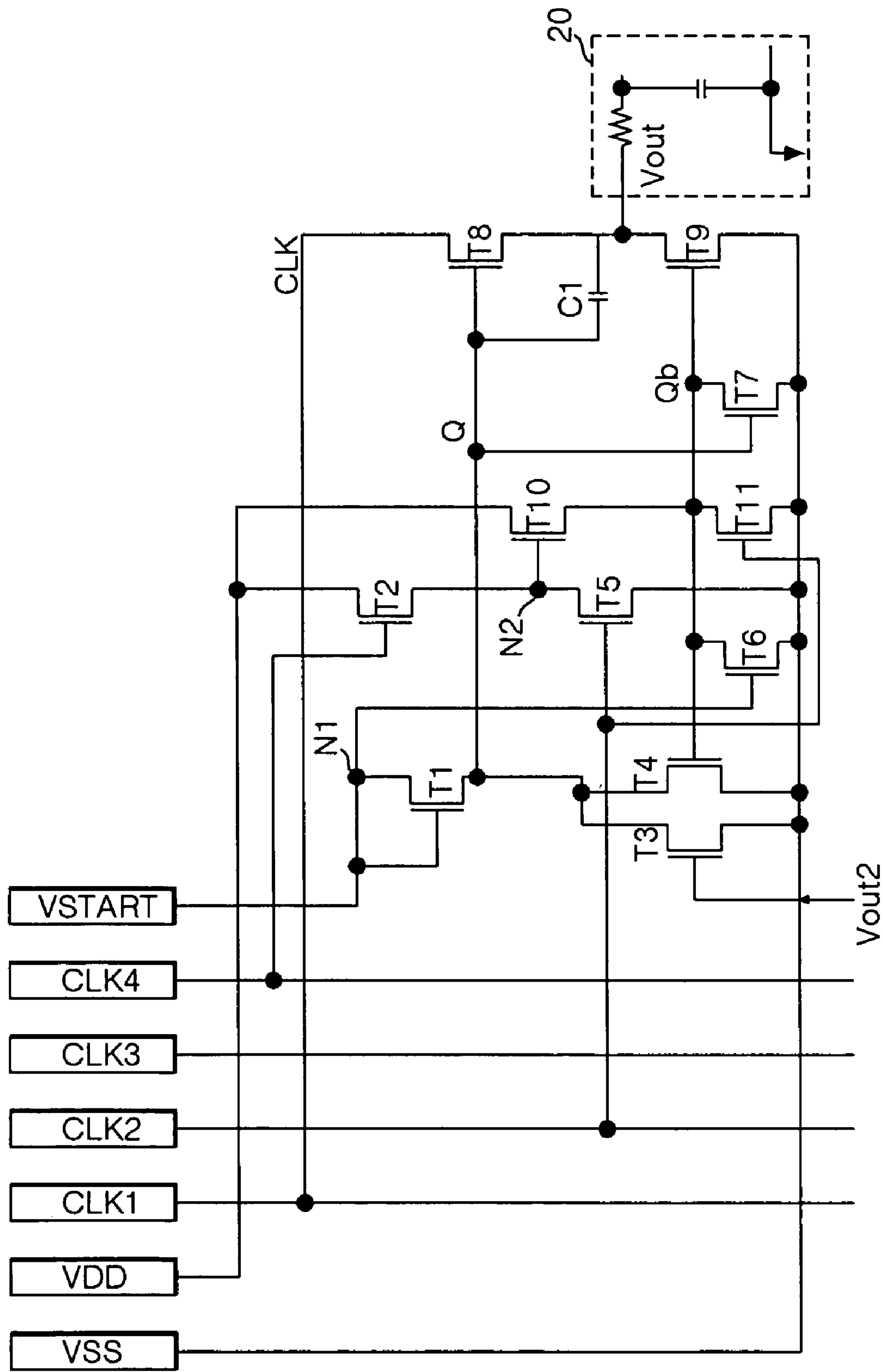
FIG. 9 is a second circuit diagram representing a stage of FIG. 5.

FIG. 9 is a second circuit diagram representing one stage of a shift register. The shift register includes n number of stages STR1 to STRn. The output lines of the n number of stages are each connected to the input terminal of a load circuit 20. Herein, the circuit connected to the output terminal Vout equivalently represents the load circuit 20.

A start pulse Vstart from a timing controller (not shown) is supplied to the first stage STR1, and the output signals Vout1 to Voutn−1 of the first to $(n-1)^{th}$ stages are each supplied to the next stage as a start pulse. The input signals of the shift register circuit have a designated period, and are applied from a power source circuit and a clock generator (not shown). The input signals include first to fourth clock signals CLK1 to CLK4, a supply voltage VDD and a ground voltage VSS.

Each stage STR1 to STRn has the same composition as the other except that there is no next stage input to the $n^{th}$ stage STRn as it is the last stage. Accordingly, only the first stage STR1 is taken as an example for explaining the first to n th stages STR1 to STRn.

The first stage STR1, as shown in FIG. 9, includes a first voltage supply line VSS; a second voltage supply line VDD; first to fourth clock signal lines CLK1 to CLK4; the previous stage's output signal supply line (or a start pulse supply line) Vstart; a first NMOS transistor T1 connected between a first node N1, the previous stage's output signal supply line Vstart and a Q node Q; a second NMOS transistor T2 connected between the fourth clock signal line CLK4, the second voltage supply line VDD and a second node N2; a third NMOS transistor T3 connected between the next stage's output Vout2, the first voltage supply line VSS and the Q node; a fourth NMOS transistor T4 connected between the Q node, the Qb node and the first voltage supply line VSS; a fifth NMOS transistor T5 connected between a second clock signal line CLK2, the second node N2 and the first voltage supply line VSS; a sixth NMOS transistor T6 connected between the first node N1, the Qb node and the first voltage supply line VSS; a seventh NMOS transistor T7 connected between the Q node, the Qb node and the first voltage supply line VSS; an eighth NMOS transistor T8 connected between the first clock signal line CLK1, the Q node and the output signal line Vout; a ninth NMOS transistor T9 connected between the first voltage supply line VSS, the Qb node and the output signal line Vout; a tenth NMOS transistor T10 connected between the second voltage supply line VDD, the second node N2 and the Qb node; and an eleventh NMOS transistor T11 connected between the Qb node, the second clock signal line CLK2 and the first voltage supply line VSS.

The first to seventh NMOS transistors T1 to T7, the tenth and eleventh NMOS transistors T10, T11 are a controller for controlling the output, and the eighth and ninth transistors T8, T9 are an output buffer for outputting the first clock signal CLK1.

The controller includes a Q node charge/discharge controller for controlling the charge and discharge of the Q node, a Qb node charge/discharge controller for controlling the charge and discharge of the Qb node, and a second node N2 discharger for discharging the voltage charged in the second node N2.

The Q node charge/discharge controller includes the first, third and fourth NMOS transistors T1, T3, T4 and includes a Q node charging part and a Q node discharging part. The Q node charging part includes the first NMOS transistor T1 that charges the Q node with the previous stage's output Vout or start pulse from the previous stage's output signal line Vstart or the start pulse supply line. The Q node discharging part includes the third NMOS transistor T3 that discharges the voltage charged in the Q node by the previous stage's output signal Vout2 from the next stage's output signal line Vout2, and the fourth NMOS transistor T4 that discharges the voltage charged in the Q node by the voltage charged in the Qb node.

The Qb node charge/discharge controller includes the second, fifth, sixth, seventh, tenth and eleventh NMOS transistors T2, T5, T6, T7, T10, T11 and includes a Qb node charging part and a Qb node discharging part.

The Qb node charging part includes the second NMOS transistor T2 that supplies the voltage from the second voltage supply line VDD to the tenth NMOS transistor T10 in response to the fourth clock signal line CLK4, and the tenth NMOS transistor T10 that charges the Qb node with the supply voltage from the second power supply line in response to the supply voltage from the second power supply line which is supplied through the second NMOS transistor T2.

The Qb node discharging part includes the sixth NMOS transistor T6 that discharges the voltage charged in the Qb node through the first voltage supply line in response to the previous stage's output signal or the start pulse Vstart; the eleventh NMOS transistor T11 that discharges the voltage charged in the Qb node in response to the second clock signal CLK2; and the seventh NMOS transistor T7 that discharges the voltage charged in the Qb node in response to the voltage charged in the Q node. Further, the second node N2 discharger includes the fifth NMOS transistor T5 for discharging the voltage floating in the second node in response to the clock signal from the second clock signal line CLK2.

The first to fourth clock signals CLK1 to CLK4 each have the same period, and the second clock signal CLK2 is supplied with a designated delayed interval in regard to the first clock signal CLK1, the third clock signal CLK3 is supplied with a designated delayed interval in regard to the second clock signal and the fourth clock signal CLK4 is supplied with a designated delayed interval in regard to the third clock signal. Accordingly, if the first clock signal CLK1 is high level (high or 1), the second to fourth clock signals CLK2 to CLK4 are low level (low or 0). Because of this, a rising edge time of each of the first to fourth clock signals CLK1 to CLK4 have a designated interval. The first to fourth clock signals CLK1 to CLK4 are used as a signal for supplying the output signal Vout1 to the output line Vout or for discharging the voltage charged in the shift register.

A voltage of low level L from a voltage source (not shown) is supplied to the first voltage supply line VSS, and a voltage of high level H from a voltage source (not shown) is supplied to the second voltage supply line VDD.

The first NMOS transistor T1 charges the Q node with the previous stage's output voltage Vout or the start pulse Vstart by the previous stage's output voltage Vout or the start pulse Vstart from the timing controller (not shown).

The second NMOS transistor T2 charges the Qb node with the voltage from the second voltage supply source VDD in response to the fourth clock signal CLK4. Accordingly, the second NMOS transistor T2 controls the on/off of the tenth NMOS transistor T10.

The third NMOS transistor T3 discharges the voltage charged in the Q node in response to the next stage's output signal Vout. The third NMOS transistor T3 controls the discharge of the Q node to control the on/off of the eighth NMOS transistor T8 of the output buffer and the seventh NMOS transistor T7 of the controller.

The fourth NMOS transistor T4 discharges the voltage charged in the Q node in response to the voltage charged in the Qb node. The fourth NMOS transistor T4 controls the discharge of the Q node Q to control the on/off of the eighth NMOS transistor T8 of the output buffer and the seventh NMOS transistor T7 of the controller.

The fifth NMOS transistor T5 discharges the charged voltage of the second node N2 in response to the clock signal from the second clock signal line CLK2. Accordingly, the fifth NMOS transistor T5 controls the on/off of the tenth NMOS transistor T10.

The sixth NMOS transistor T6 discharges the voltage charged in the Qb node by the previous stage's output signal Vout or the start pulse Vstart.

The seventh NMOS transistor T7 discharges the voltage charged in the Qb node in response to the voltage charged in the Q node.

The eighth NMOS transistor T8 allows the clock signal from the first clock signal line CLK1 to be outputted through the output signal line Vout in response to the voltage which is charged in and discharged from the Q node.

The ninth NMOS transistor T9 allows the ground voltage from the first voltage supply source VSS to be supplied to the output signal line Vout in response to the voltage which is charged in and discharged from the Qb node.

The tenth NMOS transistor T10 charges the Qb node with the supply voltage from the second voltage supply line VDD in response to the voltage charged in the second node N2.

The eleventh NMOS transistor T11 discharges the voltage charged in the Qb node in response to the clock signal from the second clock signal line CLK2.

A first capacitor C1 boosts the voltage in the Q node Q by as much as the voltage level of the first clock signal CLK1 when the clock signal from the first clock signal line CLK1 is supplied to the output line Vout through the eighth NMOS transistor T8. In other words, the voltage of the Q node is bootstrapped by the effect of the capacitor C1.

Herein, the gate terminal of the second NMOS transistor T2 of each shift register STR1 to STRn is connected to the fourth clock signal CLK4 in the first stage STR1, to the first clock signal CLK1 in the second stage STR2, to the second clock signal CLK2 in the third stage STR3, to the third clock signal CLK3 in the fourth stage STR4, and again to the fourth clock signal CLK4 in the fifth stage STR5.

Further, the gate terminal of the fifth and eleventh NMOS transistors T5, T11 of each shift register STR1 to STRn is connected to the second clock signal CLK2 in the first stage STR1, to the third clock signal CLK3 in the second stage STR2, to the fourth clock signal CLK4 in the third stage STR3, and to the first clock signal CLK1 in the fourth stage STR4.

In addition, the eighth NMOS transistor T8 of each shift register STR1 to STRn is connected to the first clock signal CLK1 in the first stage STR1, to the second clock signal CLK2 in the second stage STR2, to the third clock signal CLK3 in the third stage STR3, and to the fourth clock signal CLK4 in the fourth stage STR4. In this way, the second NMOS transistor T2, the eighth NMOS transistor T8 and the fifth NMOS transistor T5 are connected to the first to fourth clock signal lines CLK1 to CLK4 by stages.

The driving method of the shift registers according to the second embodiment of the present invention is the same as the drive waveform shown in FIG. 7, thus the driving method of the shift registers according to the second embodiment will be explained in conjunction with FIGS. 7 and 9.

Referring to FIGS. 7 and 9, in a T1 period, the start pulse Vstart or the previous stage's output signal is inputted to the first stage STR1 in synchronization with the fourth clock signal CLK4. If the start pulse Vstart is inputted, the first NMOS transistor T1 is turned on and the Q node is charged with as much voltage as the start pulse Vstart. In addition, the sixth NMOS transistor T6 is turned on by the start pulse Vstart. At the same time, if the fourth clock signal CLK4 is inputted, the second NMOS transistor T2 is turned on and the second node N2 is charged with the supply voltage from the second voltage supply source VDD. The tenth NMOS transistor T10 is turned on by the voltage charged in the second node N2 to charge the Qb node with the supply voltage from the second voltage supply source VDD. However, the voltage charged in the Qb node is discharged by the seventh NMOS transistor T7 which is turned on by the voltage charged in the Q node, and the sixth NMOS transistor T6 which is turned on by the fourth clock signal CLK4, thereby maintaining the Qb node at the low level.

In a T2 period, the fourth clock signal CLK4 and the start pulse Vstart are not supplied to the first stage STR1 and only the first clock signal CLK1 is applied to the first stage STR1. The first and second NMOS transistors, T2 are tumed off because the fourth clock signal CLK4 and the start pulse Vstart are not supplied. Hereby, the voltage charged in the Q node has its charging and discharging path blocked to make the Q node float into a high state, and the floated Q node causes the seventh and eighth NMOS transistors T7, T8 to remain in a turn-on state even in the T2 period. The seventh NMOS transistor T7 remaining in the turn-on state keeps the Qb node to be connected with the first voltage supply source VSS even in T2 period in order that the Qb node is sure to be maintained in the low state. In addition, the first clock signal CLK 1 is outputted through the output signal line Vout via the eighth NMOS transistor T8 which remains turned on. At this moment, the voltage of the Q node is bootstrapped by the first capacitor C1 which is charged by the first clock signal CLK1, thereby becoming a higher level than the high level.

In a T3 period, the output of the next stage, i.e., the second stage STR2, is supplied to the third NMOS transistor T3 to turn on the third NMOS transistor T3. Further, the fifth and eleventh NMOS transistor T5, T11 are turned on by the clock signal from the second clock signal line CLK2. The voltage charged in the Q node by the turned-on third NMOS transistor T3 is discharged through the first voltage supply source VSS via the third NMOS transistor T3. Hereby, the seventh NMOS transistor T7 is turned off. On the other hand, the floating voltage remaining in the second node N2 is discharged by the turned-on fifth NMOS transistor T5, thereby completely turning off the tenth NMOS transistor T10. Also, the turned-on eleventh NMOS transistor T11 causes the Qb node to be stably maintained at the low level.

In a T4 period, no clock signal is supplied to the first stage STR1, thus the Q node and the Qb node all are maintained at the low level. Further, the output signal Vout1 outputted to the output signal line Vout is consumed in the load circuit 20 to become the low state.

In a T5 period, the start pulse Vstart or the previous stage's output signal Vout is not supplied and only the fourth clock signal CLK4 is supplied to the second NMOS transistor T2, thereby turning on the second NMOS transistor T2. Hereby, the supply voltage from the second voltage supply source VDD is supplied to the second node N2 through the turned-on second NMOS transistor T2 to turn on the tenth NMOS transistor T10. The supply voltage from the second voltage supply source VDD by the turned-on tenth NMOS transistor T10 is charged in the Qb node so that the voltage of the Qb node is at a high level. On the other hand, in the T5 penod, the voltage charged in the Qb node is not discharged and the Qb node is maintained at the high level.

In a T6 period, only the first clock signal CLK1 is supplied to the first stage STR1. However, the first clock signal CLK1 is not supplied to the output signal line Vout because the eighth NMOS transistor T8 remains to be turned off. Further, the voltage charged in the second node N2 is maintained in the high level floating state as the second NMOS transistor T2 and the fifth NMOS transistor T5 are turned off, thereby maintaining the tenth NMOS transistor T10 in the turn-on state. Hereby, the supply voltage from the second voltage supply source VDD which is supplied through the tenth NMOS transistor T10 is charged in the Qb node.

In a T7 period, only the second clock signal CLK2 is supplied to the first shift register STR1 to turn on the fifth and eleventh NMOS transistors T5, T11. The turned-on fifth NMOS transistor T5 discharges the voltage charged in the second node N2, and the tenth NMOS transistor T10 is turned off so that the supply voltage from the second voltage supply source VDD cannot be supplied to the Gb node. Further, the turned-on eleventh NMOS transistor T11 discharges the voltage charged in the Qb node to make the voltage of the Qb node changed to the low level.

In a T8 period, no clock signal is supplied to the first stage STR1, thus the voltages of the Q node, the Qb node and the output signal line Vout are continuously maintained at the low level subsequently to the T7 period.

The T5 to T8 periods are repeated in the first stage STR1 until the start pulse Vstart is inputted again thereto or one vertical period is completed.

Figure 10:
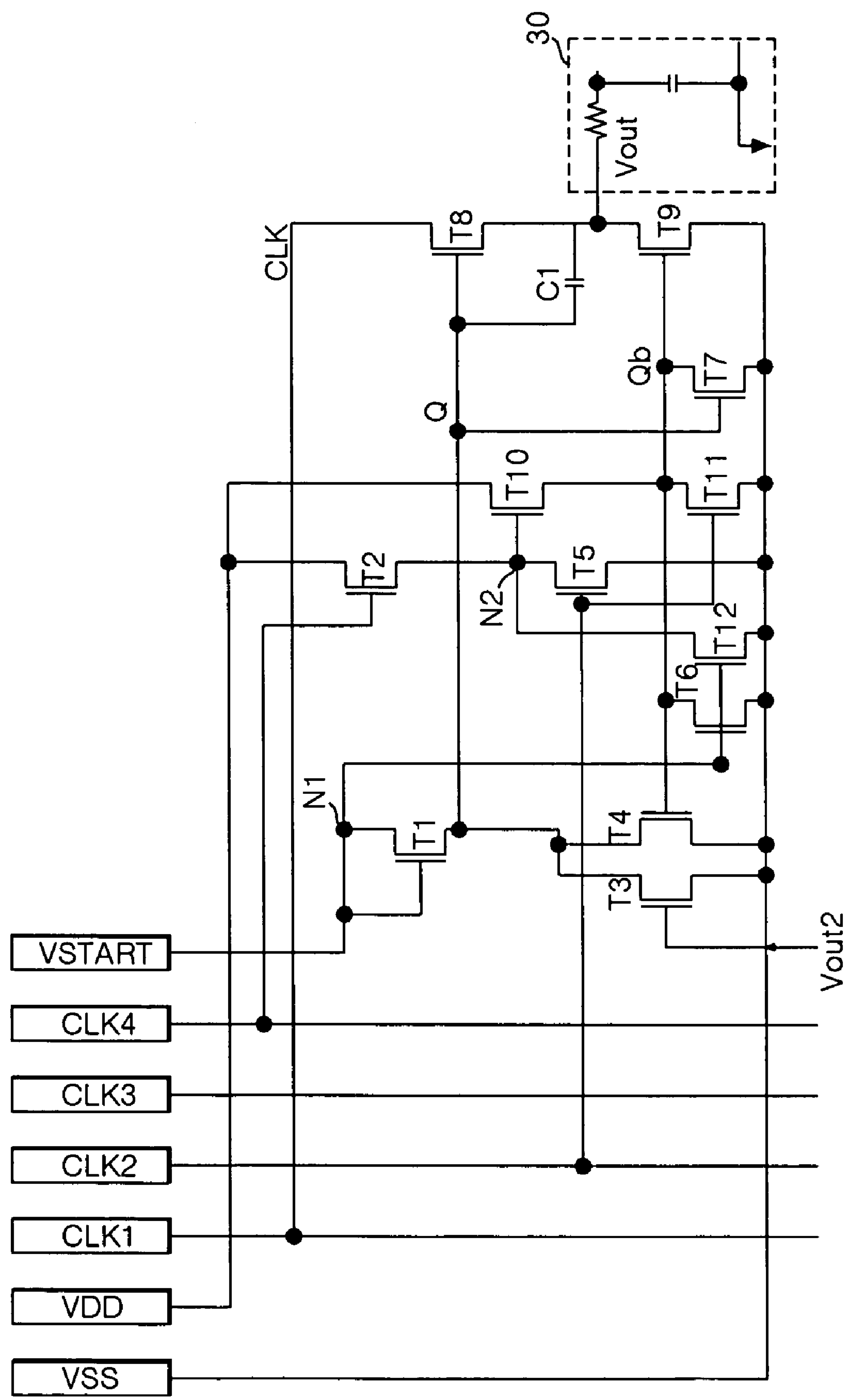
FIG. 10 is a third circuit diagram representing a stage of FIG. 5.

FIG. 10 is a third circuit diagram representing one stage of a shift register. A shift register includes n number of stages STR1 to STRn. The output lines of the n number of stages STR1 to STRn are each connected to the input terminal of a load circuit 30. Herein, the circuit connected to the output terminal Vout equivalently represents the load circuit 30.

The shift register illustrated in FIG. 10 is the same as that illustrated in FIG. 9 except that a twelfth NMOS transistor T12 is further included therein for controlling the discharge of the second node N2. Accordingly, when explaining the shift register of FIG. 10, the detailed description on the same configuration and operation as the shift register of FIG. 9 will be omitted.

Each stage STR1 to STRn has the same components as the other except that the next stage's output is not inputted to the $n^{th}$ stage STRn. Accordingly, hereinafter, by taking only the first stage STR1 as an example, the first to $n^{th}$ stages STR1 to STRn will be explained.

The first stage STR1, as shown in FIG. 10, includes a first voltage supply line VSS; a second voltage supply line VDD; first to fourth clock signal lines CLK1 to CLK4; the previous stage's output signal supply line (or a start pulse supply line) Vstart; a first NMOS transistor T1 connected between a first node N1, the previous stage's output signal supply line Vstart and a Q node Q; a second NMOS transistor T2 connected between the fourth clock signal line CLK4, the second voltage supply line VDD and a second node N2; a third NMOS transistor T3 connected between the next stage's output Vout2, the first voltage supply line VSS and the Q node; a fourth NMOS transistor T4 connected between the Q node, the Qb node and the first voltage supply line VSS; a fifth NMOS transistor T5 connected between a second clock signal line CLK2, the second node N2 and the first voltage supply line VSS; a sixth NMOS transistor T6 connected between the first node N1, the Qb node and the first voltage supply line VSS; a seventh NMOS transistor T7 connected between the Q node, the Qb node and the first voltage supply line VSS; an eighth NMOS transistor T8 connected between the first clock signal line CLK1, the Q node and the output signal line Vout; a ninth NMOS transistor T9 connected between the first voltage supply line VSS, the Qb node and the output signal line Vout; a tenth NMOS transistor T10 connected between the second voltage supply line VDD, the second node N2 and the Qb node; an eleventh NMOS transistor T11 connected between the Qb node, the second clock signal line CLK2 and the first voltage supply line VSS; and a twelfth NMOS transistor T12 connected between the first node N1, the second node N2 and the first voltage supply line VSS.

Further, the second node N2 discharger includes the fifth NMOS transistor T5 for discharging the voltage floated in the second node N2 in response to the clock signal from the second clock signal line CLK2; and a twelfth NMOS transistor T12 for discharging the voltage charged in the second node N2 in response to the output signal of the previous stage or to the start pulse Vstart.

The driving method of the shift registers according to the third embodiment of the present invention is the same as the drive waveform shown in FIG. 7, thus the driving method of the shift registers according to the third embodiment will be explained in conjunction with FIGS. 7 and 10.

Referring to FIGS. 7 and 10, in a T1 period, the start pulse Vstart or the previous stage's output signal is inputted to the first stage STR1 in synchronization with the fourth clock signal CLK4. If the start pulse Vstart is inputted, the first NMOS transistor T1 is turned on and the Q node is charged with as much voltage as the start pulse Vstart. In addition, the sixth NMOS transistor T6 and the twelfth NMOS transistor T12 are turned on by the start pulse Vstart. At the same time, if the fourth clock signal CLK4 is inputted, the second NMOS transistor T2 is turned on and the second node N2 is charged with the supply voltage from the second voltage supply source VDD. The tenth NMOS transistor T10 is turned on by the voltage charged in the second node N2 to charge the Qb node with the supply voltage from the second voltage supply source VDD. However, the voltage charged in the Qb node is discharged by the seventh NMOS transistor T7 which is turned on by the voltage charged in the Q node, and the sixth NMOS transistor T6 which is turned on by the fourth clock signal CLK4, thereby maintaining the Qb node at the low level. And, the supply voltage charged in the second node N2 is discharged by the turned-on twelfth NMOS transistor T12 to turn off the tenth NMOS transistor T10. The third embodiment of the present invention discharges the supply voltage charged in the second node N2 by the twelfth NMOS transistor T12 and has the Qb node not to be charged, thereby improving the response speed of the circuit in comparison with the second embodiment.

Hereinafter, the operation of the shift register of the T2 period to the T8 period is the same as the foregoing second embodiment, thus the detail explanation on this will be omitted.

It is desirable that the penod during which the logic value of the Qb node is high, and while the logic value of the output signal line is low, includes a clock signal when the output signal of the pertinent stage is generated, e.g., the period when the first clock signal is inputted in the first stage.

The present invention can reduce the accumulated voltage stress which is generated by a continuous voltage application to the Qb node. Further, the shift register and driving method thereof can be driven by a two-phase, a three-phase or a five-phase clock.

Figure 11:
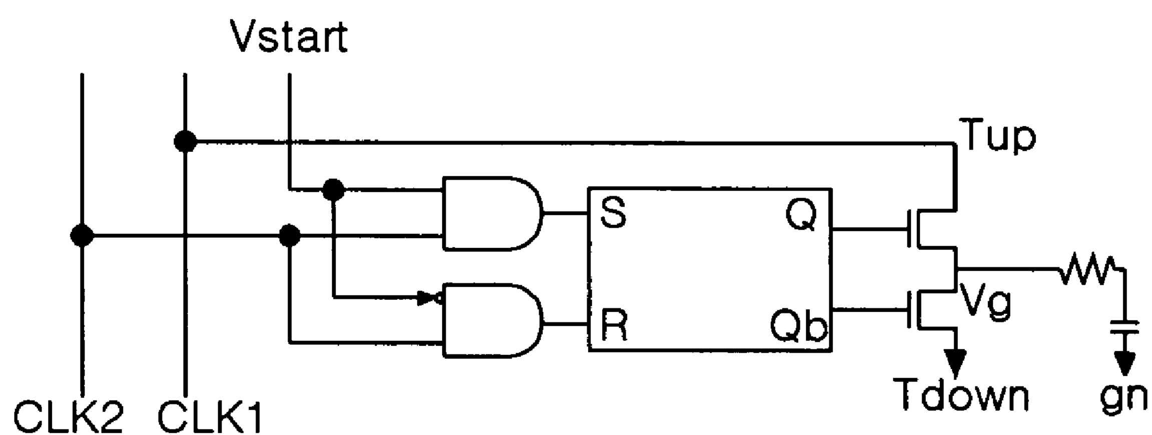
FIG. 11 is a diagram briefly representing a composition of a shift register of the present invention.

FIG. 11 is a diagram briefly representing the configuration of the shift register of the present invention, and represents an example of using a two phase clock in a simple circuit.

Referring to FIG. 11, the shift register includes a logic device, a switching signal generator and a thin film transistor. The logic device supplies a drive signal for generating a switching signal to the switching signal generator by the clock signal and the start pulse. For this, the logic device is connected to the clock signal line, the start pulse input line and the switching signal generator.

The switching signal generator is composed of a flip-flop and so on, and generates the switching signal for controlling the on/off of the thin film transistors Tup, Tdown by the drive signal from the logic device. For this, the switching signal generator is connected to the logic device and the thin film transistor Tup, Tdown.

The thin film transistor Tup, Tdown is on/off by the switching signal from the switching signal generator to supply the gate signal to the gate line gn.

In this way, by use of the circuit having the two phase clock signal, it is possible to prevent the malfunction and damage caused by the deterioration by having the voltage of the Qb node turned on/off repeatedly, which is the spirit of the invention.

Figure 12:
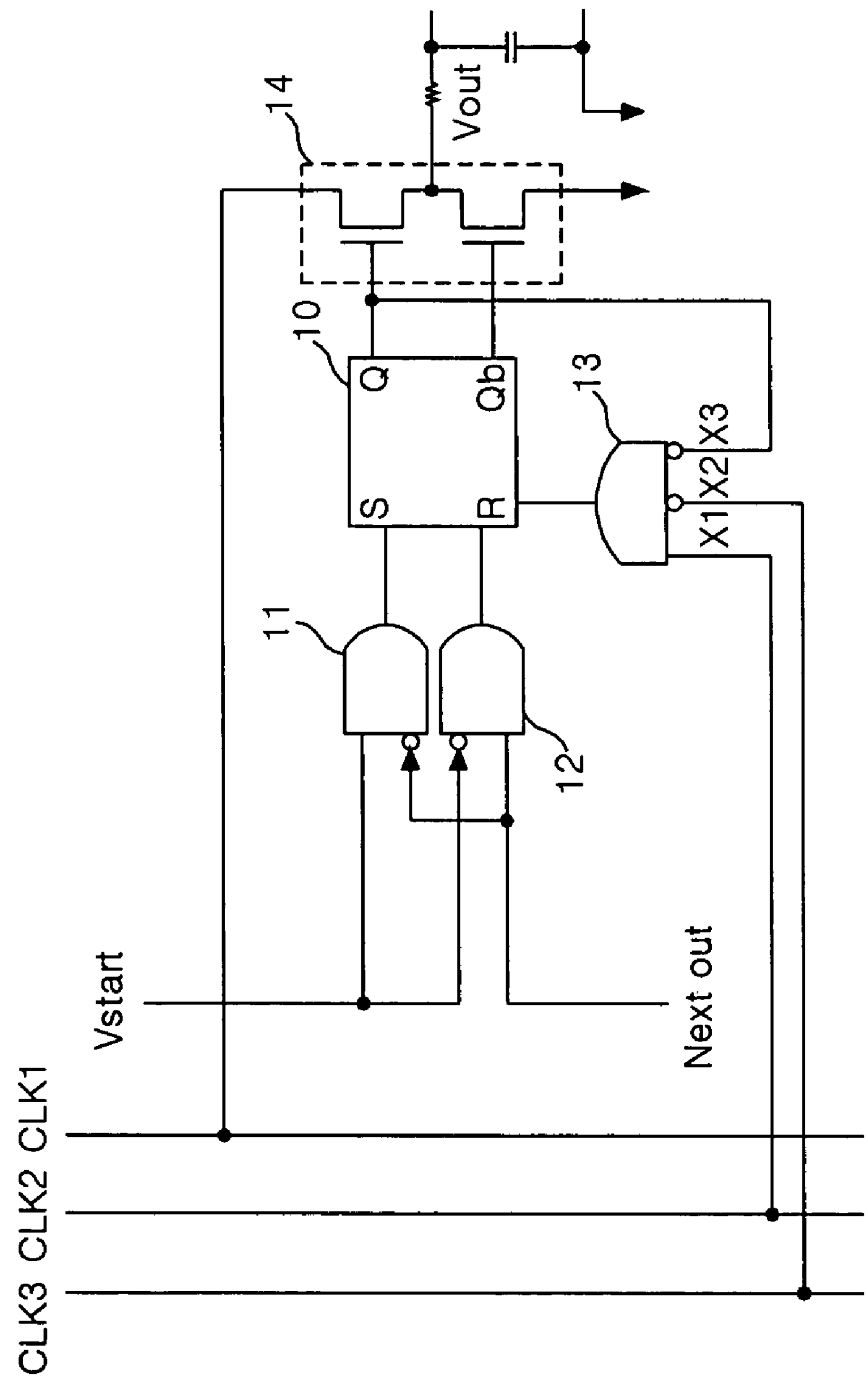
FIG. 12 is a diagram representing a shift register of the present invention for using a three phase.

FIG. 12 is a diagram representing a shift register of the present invention using three-phases. TABLE 1 represents the truth value of the switching signal generator of FIG. 12. Referring to FIG. 12 and TABLE 1, the shift register using the three-phase of FIG. 12, differently from FIG. 11, further includes a logic device that controls the switching signal generator by the logic value of the second and third clocks CLK2, CLK3 and the Q node.

A first logic device 11 and a second logic device 12 control an output buffer 14 to output the first clock signal by the start pulse Vstart or the previous stage's output signal.

A third logic device 13 controls the voltage of the Qb node to alternate repeatedly between high and low according to the logic values of the second clock signal CLK2, the third clock signal CLK3 and the Q node. The third logic device 13 controls the voltage of the Qb node so that the period when the voltage of the Qb node is high includes the period when the first clock signal CLK1 is high.

TABLE 1

| S | R | Q | Qb |
|---|---|---|---|
| 1 | 0 | 1 | 0 |
| 0 | 1 | 0 | 1 |
| 0 | 0 | Q | Qb |
| 1 | 1 | * | * |

As in TABLE 1, if the output value from the first logic device 11 is a high logic value and the output value of the second logic device 12 is a low logic value, the first clock signal CLK1 is outputted through the output buffer 14.

After being outputted, in the next clock signal period, the shift register is controlled such that the logic values of the first and second logic devices 11, 12 are inverted so that no signal is outputted through the output buffer 14.

If the gate signal is outputted through the output buffer 14, the logic value of the Qb node is controlled to be alternated by the second clock signal and the third clock signal.

Even in the case of using a three-phase clock like this, it is possible to apply the spirit of this invention thereto by using the previous stage's output signal or the start pulse, the next stage's output signal and the current stage's Q node logic value.

In the case of using a clock of not less than five phases, only the period of on/off repetition is changed in comparison with the foregoing embodiments, thus prediction can be easily made by the foregoing embodiments. Since the three-phase is selectively utilized in the three phase clock in the above-mentioned embodiment, it is made clear that it does not depart from the spirit of the invention even that one phase is removed from or added to four phases.

As described above, the shift register according to the present invention provides the supply voltage so that the high logic value and the low logic value are repeated in the second output terminal. Hereby, the shift register according to the present invention periodically reduces the voltage accumulated in the second output terminal, thereby enabling to maintain the accumulated voltage stress of the second output terminal within a normal operation range. Accordingly, in the shift register of the present invention, it is possible to prevent the malfunction of the shift register caused by the deterioration by the accumulated voltage stress of the second output terminal and to prevent the damage of the device and circuit caused by the deterioration.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. A shift register having a plurality of stages each which output an output signal through an output signal line by using any three of a first voltage supply source, a previous stage's output signal, a next stage's output signal, and first to fourth clock signals, comprising:

a transistor to output the first clock signal through the output signal line in response to a logic value of a Q node;

a transistor to supply a supply voltage from the first voltage supply source to the output signal line in response to a logic value of a Qb node;

a Q node controller to control the logic value of the Q node in response to anyone of the previous stage's output signal and the next stage's output signal;

a Qb node controller to control the logic value of the Qb node to alternate repeatedly between low and high by use of at least one of the second clock signal, the fourth clock signal and the logic value of the Q node when the output signal line is in a low state;

wherein the Q node controller comprises a first switch connected between the Q node and the previous stage's output signal line to be controlled by the previous stage's output signal; a second switch connected between the Q node and the first voltage supply source to be controlled by the next stage's output signal; and a third switch connected between the first voltage supply source and the Q node to be controlled by the logic value of the Qb node; and wherein the Qb node controller comprises, A fourth switch connected between a second voltage supply source from which a second voltage is supplied, and the Qb node to be controlled by the fourth clock signal; a fifth switch connected between the Qb node and the first voltage supply source to be controlled by the second clock signal; a sixth switch connected between the Qb node and the first voltage supply source to be controlled by the previous stage's output signal; and a seventh switch connected between the Qb node and the first voltage supply source to be controlled by the logic value of the Q node.

2. The shift register according to claim 1, further comprising a capacitor connected between the Q node and the output signal line.

3. The shift register according to claim 1, wherein the fourth switch is connected between the second voltage supply source and a second node.

4. The shift register according to claim 3, further comprising a capacitor connected between the first node output signal line.

5. The shift register according to claim 4, further comprising:

an eighth switch connected between the second voltage supply source and the Qb node to be controlled by a logic value of the second node.

6. The shift register according to claim 5, wherein the Qb node controller further comprises:

a ninth switch connected between the Qb node and the first voltage supply source to be controlled by the second clock signal.

7. The shift register according to claim 6, wherein the Qb node controller further comprises:

a tenth switch connected between the second node and the first voltage supply source to be controlled by the previous stage's output signal.

* * * * *